United States Patent
Fu et al.

(10) Patent No.: US 11,211,256 B2
(45) Date of Patent: Dec. 28, 2021

(54) METHOD WITH CMP FOR METAL ION PREVENTION

(71) Applicant: Taiwan Semiconductor Manufacturing Co., Ltd., Hsin-Chu (TW)

(72) Inventors: Shih-Kang Fu, Taoyuan County (TW); Ming-Han Lee, Taipei (TW); Shau-Lin Shue, Hsinchu (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

(21) Appl. No.: 16/801,526

(22) Filed: Feb. 26, 2020

(65) Prior Publication Data
US 2021/0265172 A1    Aug. 26, 2021

(51) Int. Cl.
| H01L 21/321 | (2006.01) |
| H01L 21/768 | (2006.01) |
| H01L 21/02 | (2006.01) |
| H01L 21/67 | (2006.01) |
| C09G 1/02 | (2006.01) |
| H01L 21/3213 | (2006.01) |

(52) U.S. Cl.
CPC .......... H01L 21/3212 (2013.01); C09G 1/02 (2013.01); H01L 21/02074 (2013.01); H01L 21/3213 (2013.01); H01L 21/67075 (2013.01); H01L 21/7684 (2013.01); H01L 21/76816 (2013.01)

(58) Field of Classification Search
CPC .......... H01L 21/3212; H01L 21/67075; H01L 21/76816; H01L 21/02074; H01L 21/3213; H01L 21/7684; C09G 1/02

USPC .................................................. 438/690–693
See application file for complete search history.

(56) References Cited

U.S. PATENT DOCUMENTS

| 5,563,105 | A | * | 10/1996 | Dobuzinsky | .......... C23C 16/401 438/784 |
| 6,093,651 | A | * | 7/2000 | Andideh | ................. B24B 37/26 216/38 |
| 8,017,504 | B2 | * | 9/2011 | Griebenow | ..... H01L 21/823807 438/478 |
| 8,772,109 | B2 | | 7/2014 | Colinge | |
| 8,785,285 | B2 | | 7/2014 | Tsai et al. | |
| 8,816,444 | B2 | | 8/2014 | Wann et al. | |
| 8,823,065 | B2 | | 9/2014 | Wang et al. | |
| 8,860,148 | B2 | | 10/2014 | Hu et al. | |
| 9,105,490 | B2 | | 8/2015 | Wang et al. | |

(Continued)

*Primary Examiner* — Duy Vu N Deo
(74) *Attorney, Agent, or Firm* — Haynes and Boone, LLP

(57) ABSTRACT

The present disclosure provides a method for fabricating a semiconductor structure that includes a first dielectric layer over a semiconductor substrate, and a first cap layer over the first dielectric layer. The method includes forming a first metal feature in the first dielectric layer; performing a first CMP process on the first metal feature using a first rotation rate; and performing a second CMP process on the first metal feature using a second rotation rate slower than the first rotation rate. The second CMP process may be time-based. The second CMP process may stop on the first cap layer. After performing the second CMP process, the method includes removing the first cap layer. The first CMP process may have a first polishing rate to the first metal feature. The second CMP process may have a second polishing rate to the first metal feature lower than the first polishing rate.

20 Claims, 15 Drawing Sheets

(56) References Cited

U.S. PATENT DOCUMENTS

| | | | |
|---|---|---|---|
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 2004/0009653 A1* | 1/2004 | Ueda | H01L 21/7684 |
| | | | 438/622 |
| 2006/0046490 A1* | 3/2006 | Banerjee | C11D 7/20 |
| | | | 438/692 |

* cited by examiner

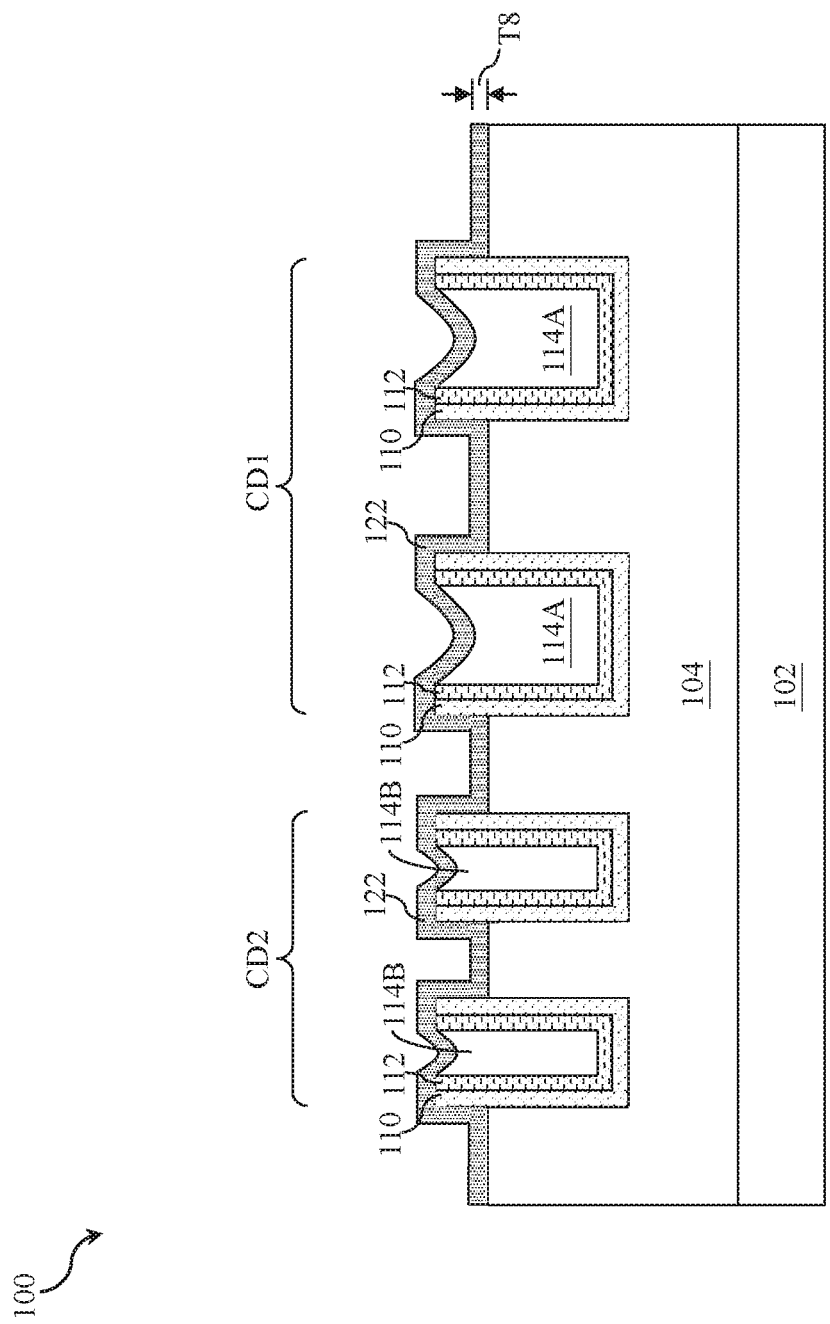

… (US 11,211,256 B2)

METHOD WITH CMP FOR METAL ION PREVENTION

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that may be created using a fabrication process) has decreased.

Though advancements in processing ICs at reduced length scales have generally been adequate, they have not been satisfactory in all aspects. For example, in instances where devices of different densities are needed in nearby regions, challenges arise in terms of performing fabrication processes that would accommodate varying device characteristics. Specifically, devices with higher densities (i.e., located in closer proximity) may suffer inadvertent shortcomings when subjected to a chemical mechanical polishing/planarization (CMP) process that utilizes an oxidizing slurry to remove one or more materials. Accordingly, for at least this reason, improvements in methods of implementing CMP processes are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 10A-10E are cross-sectional views illustrating another embodiment of a semiconductor device at various stages of the method depicted in FIG. 1 according to one or more aspects of the present disclosure.

DETAILED DESCRIPTION

Figure 1:
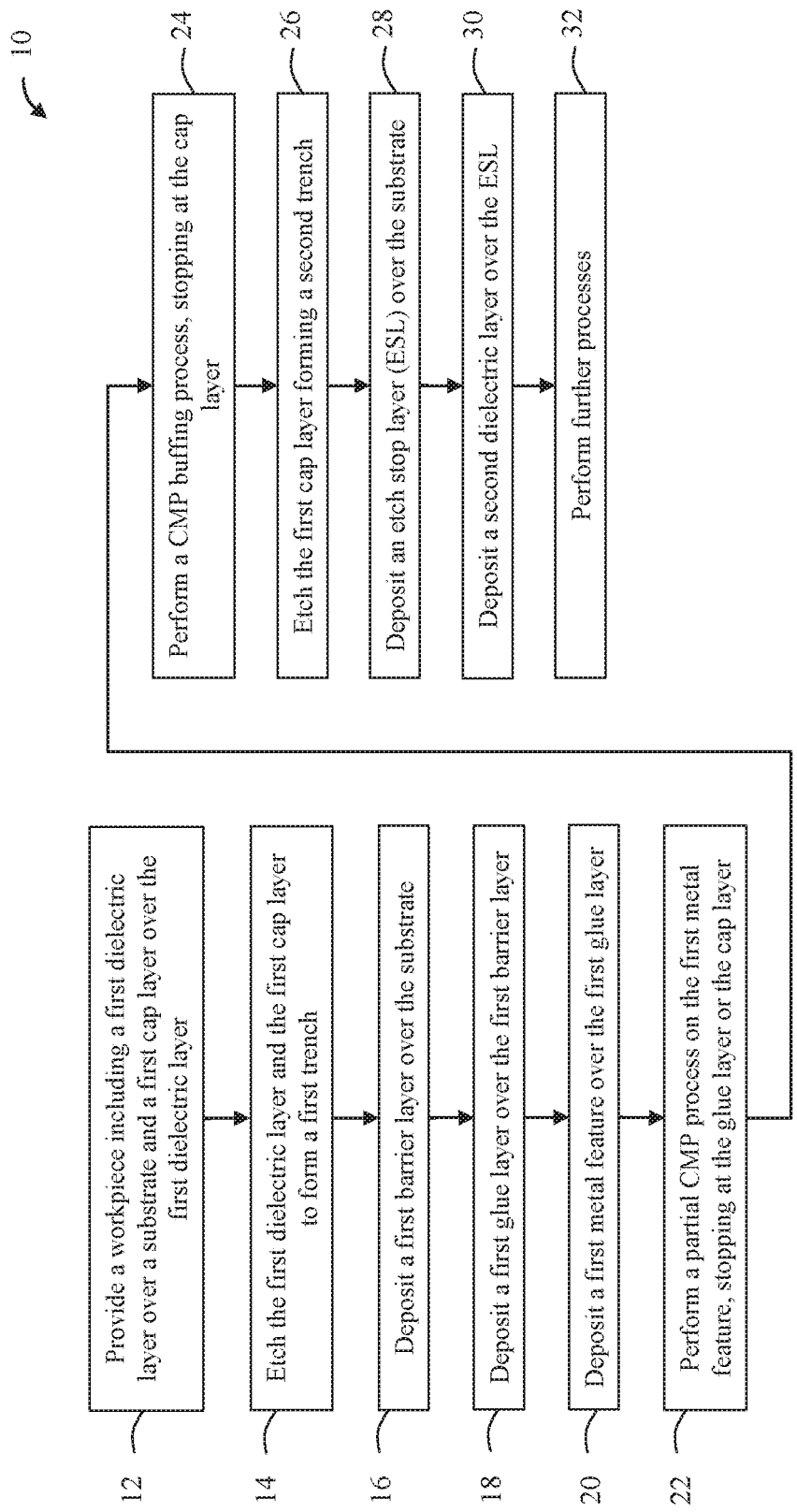
FIG. 1 is a flow chart of a method of fabricating a semiconductor device according to one or more aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/− 10% of the number described or other values as understood by person skilled in the art. For example, the term "about 5 nm" encompasses the dimension range from 4.5 nm to 5.5 nm.

It is also noted that the present disclosure presents embodiments of chemical mechanical polishing/planarizing (CMP) processes, including CMP slurries, useful for the fabrication of planar, multi-gate, gate-all-around (GAA), Omega-gate ($\Omega$-gate), or Pi-gate ($\Pi$-gate) devices. In some embodiments, such a device may include a p-type metal-oxide-semiconductor (PMOS) device and/or an n-type metal-oxide-semiconductor (NMOS) device. In one example, the present disclosure is directed to a FinFET device. Embodiments of the present disclosure may be equally applicable to fabrication of other devices not discussed above.

During a CMP process, a surface of a substrate is acted upon by a slurry and a polishing pad. For example, a force may be applied to press the substrate against the pad while the substrate and the pad are rotated. The rotation and the substrate-to-pad force, in conjunction with the slurry supplied to the substrate, serve to remove substrate material and thus planarize the surface of the substrate. Generally, the substrate may include a metal or metal liner for high conductivity and for enhancing gap fill. The metal may be a noble metal, including without limitation Ru, Ir, Rh, Pt, Au, Pd, or combinations thereof. Generally, the CMP slurry may include at least an oxidant to oxidize the material on the surface to be removed, as well as an abrasive to mechanically remove the oxidized material. In many instances, the oxidant, such as hydrogen peroxide, oxidizes one or more materials (e.g., conductive materials) at the surface of the substrate to allow greater ease of CMP removal. However, at reduced length scale, interaction between the oxidant and materials to be polished may lead to inadvertent shortcomings affecting the reliability of the resulting device. For instance, when performing a CMP process on a substrate including a metal layer, a byproduct metal oxide or metal ion may form. If the substrate includes any low-k dielectric material layers exposed during the CMP process, then the metal oxide or metal ion may remain on a surface of the substrate. The metal oxide or metal ion contaminant may be difficult to clean from the surface. Furthermore, the metal oxide or metal ion may penetrate into the low-k material contributing to or accelerating time-dependent dielectric breakdown (TDDB). Therefore, for these and other reasons, improvements in CMP processes and/or slurries are desirable in fabricating semiconductor devices.

FIG. 1 illustrates a method 10 of a semiconductor fabrication process in accordance with one or more of the embodiments described herein. It is understood that the method 10 may include additional steps performed before, after, and/or during the method 10. It is also understood that the process steps of method 10 are merely examples and are not intended to be limiting beyond what is specifically recited in the claims that follow.

Blocks of the method 10 of FIG. 1 may be better described in conjunction with FIGS. 2-9. FIGS. 2-9 are fragmentary cross-sectional diagrammatic views of a workpiece 100 of an IC device at various fabrication stages of a method, such as method 10 of FIG. 1, according to various aspects of the present disclosure. Workpiece 100 can be included in a microprocessor, a memory, and/or other IC device. In some implementations, workpiece 100 is a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. The transistors may be planar transistors or non-planar transistors, such as fin-like FETs (FinFETs) or gate-all-around (GAA) transistors. FIGS. 2-9 have been simplified for the sake of clarity to better understand the inventive concepts of the present disclosure. Additional features can be added in workpiece 100, and some of the features described below can be replaced, modified, or eliminated in other embodiments of workpiece 100. Moreover, it is noted that the process steps of the method 10, including any descriptions given with reference to FIGS. 2-9, are merely examples and are not intended to be limiting beyond what is specifically recited in the claims that follow.

Figure 2:
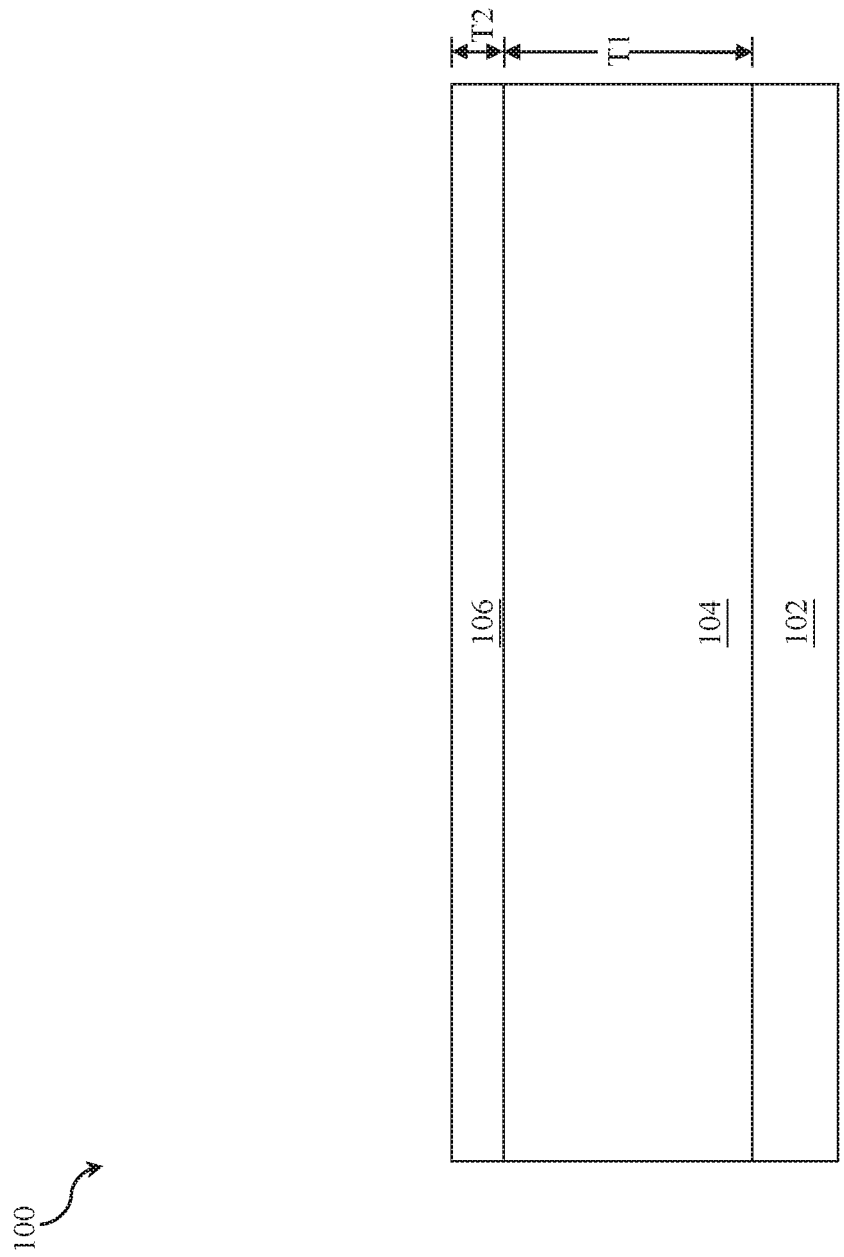
FIGS. 2-9 are cross-sectional views illustrating an embodiment of a semiconductor device at various stages of the method depicted in FIG. 1 according to one or more aspects of the present disclosure.

Reference is made to FIGS. 1 and 2. The method 10 starts with block 12 where a workpiece 100 is provided. The workpiece 100 includes a substrate 102, a first dielectric layer 104 disposed over the substrate 102, and a first cap layer 106 disposed over the first dielectric layer 104. In some embodiments, the substrate 102 may be a semiconductor substrate such as a silicon substrate. The substrate 102 may include various layers, including conductive or insulating layers formed thereon. The substrate 102 may include various doping configurations depending on various design requirements. The substrate 102 may also include other semiconductors such as germanium, silicon carbide (SiC), silicon germanium (SiGe), or diamond. Alternatively, the substrate 102 may include a compound semiconductor and/or an alloy semiconductor. Further, the substrate 102 may optionally include an epitaxial layer (epi-layer), may be strained for performance enhancement, may include a silicon-on-insulator (SOI) structure, and/or have other suitable enhancement features. The isolation regions may include silicon oxide, silicon nitride, silicon oxynitride, fluoride-doped silicate glass (FSG), a low-k dielectric material, and/or other suitable materials. In many embodiments, the isolation regions include shallow trench isolation (STI) features. The first dielectric layer 104 includes a dielectric material, such as silicon oxide, high-k dielectric material, other suitable dielectric material, or combinations thereof. High-k dielectric material generally refers to dielectric materials having a high dielectric constant, for example, greater than a dielectric constant of silicon oxide (k≈3.9). Exemplary high-k dielectric materials include hafnium, aluminum, zirconium, lanthanum, tantalum, titanium, yttrium, oxygen, nitrogen, other suitable constituent, or combinations thereof. In some embodiments, a thickness T1 of the first dielectric layer 104 may range from about 300 Å to about 1000 Å. In some embodiments, the first cap layer 106 may include a metal nitride, such as TiN, MnN, CoN, WN, MoN, or combinations thereof. The first cap layer 106 may be deposited using physical vapor deposition (PVD), chemical vapor deposition (CVD), or atomic layer deposition (ALD). In one or more embodiments, a thickness T2 of the first cap layer 106 may range from about 50 Å to about 150 Å. In some embodiments, the first cap layer 106 may function like a polish stop layer. In some embodiments, the first cap layer 106 may be readily removed by wet etching. In some embodiments, the first cap layer 106 may have a higher dielectric constant than the first dielectric layer 104.

Figure 3:
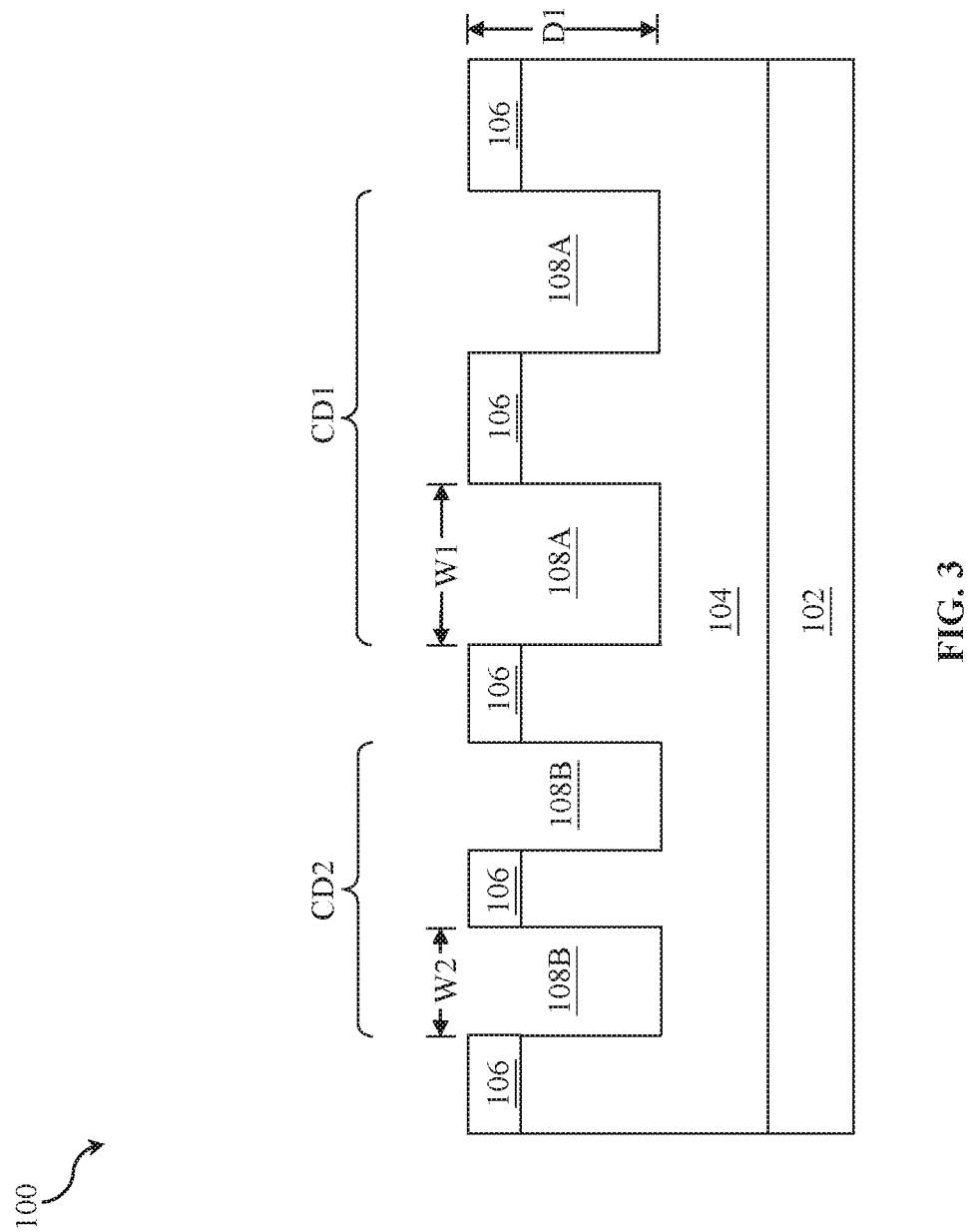

Referring now to FIGS. 1 and 3, the method 10 proceeds to block 14 where the first cap layer 106 and the first dielectric layer 104 are patterned to form a first trench 108. In some embodiments, the patterning may be achieved using lithography techniques. The patterning may include forming a masking element (not depicted) over the first cap layer 106, where the masking element includes a lithographic resist material (e.g., a photoresist layer) configured to undergo chemical changes when exposed to a radiation source (e.g., an extreme ultraviolet, or EUV, source) through a lithographic mask or reticle. After being subjected to radiation exposure, the masking element may then be developed (followed by an optional baking process) to transfer the pattern on the lithography mask onto the masking element. The patterned masking element may then be used as an etch mask to form an opening in the first cap layer 106 and the first dielectric layer 104, after which the patterned masking element is removed by any suitable method such as wet etching or plasma ashing. In some embodiments, the first cap layer 106 and the first dielectric layer 104 may be etched using a dry etching or a wet etching process. In some embodiments, a depth D1 of the first trench 108 may be about 200-800 Å. In some embodiments, the workpiece 100 may include a first region CD1. The first region CD1 may include features having a first critical dimension, such as first trench 108A having width W1. In some embodiments, the width W1 may be about 0.1-50 μm. In some embodiments, the workpiece 100 may include a second region CD2. The second region CD2 may include features having a second critical dimension, such as first trench 108B having width W2. In some embodiments, the width W2 may be about 0-100 nm.

Figure 4:
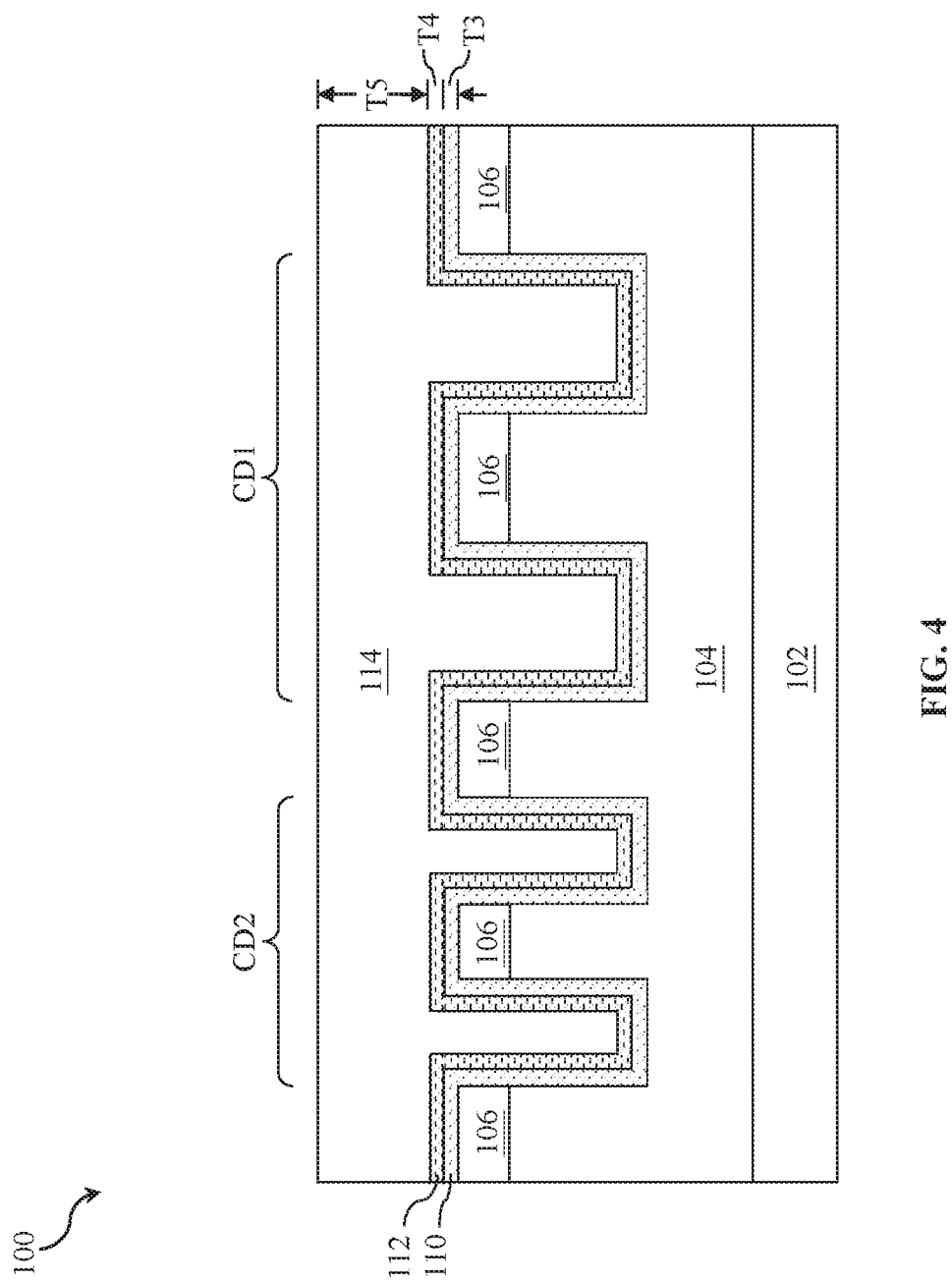

Referring now to FIGS. 1 and 4, the method 10 proceeds to block 16 where a first barrier layer 110 is deposited over the workpiece 100. In some embodiments, the first barrier layer 110 includes a metal or metal nitride, such as Ta, TaN, TiN, MnN, WN, WCN, MoN, BN, CsN, RuN. OsN, ZrN, or combinations thereof. The first barrier layer 110 may be deposited using PVD, CVD, or ALD. In one or more embodiments, a thickness T3 of the first barrier layer 110 may range from about 5 Å to about 35 Å.

Referring still to FIGS. 1 and 4, the method 10 proceeds to block 18 where a first glue layer 112 is deposited over the first barrier layer 110. In some embodiments, the first glue layer 112 includes a metal, such as Ru, Ir, Rh, Pt, Au, Pd, Co, Os, Cu, Mn, Ag, or combinations thereof. The first glue layer 112 may be designed for removal only by chemical mechanical planarization/polishing (CMP) and not for removal by wet etching to prevent the first glue layer 112 from being etched deeper than design. The first glue layer 112 may be deposited using PVD or CVD. In one or more embodiments, a thickness T4 of the first glue layer 112 may range from about 5 Å to about 35 Å.

Referring still to FIGS. 1 and 4, the method 10 proceeds to block 20 where a first metal feature 114 is deposited over the first glue layer 112. In some embodiments, the first metal feature 114 includes a metal, such as Cu, Co, Mn, Ni, Al, Ag, Ru, Mo, Cr, W, Rh, Ir, Pd, Pt, Au, or combinations thereof. The first metal feature 114 may be deposited using electrochemical plating (ECP) or PVD. In one or more embodiments, a thickness T5 of the first metal feature 114 may range from about 4000 Å to about 7000 Å.

Figure 5:
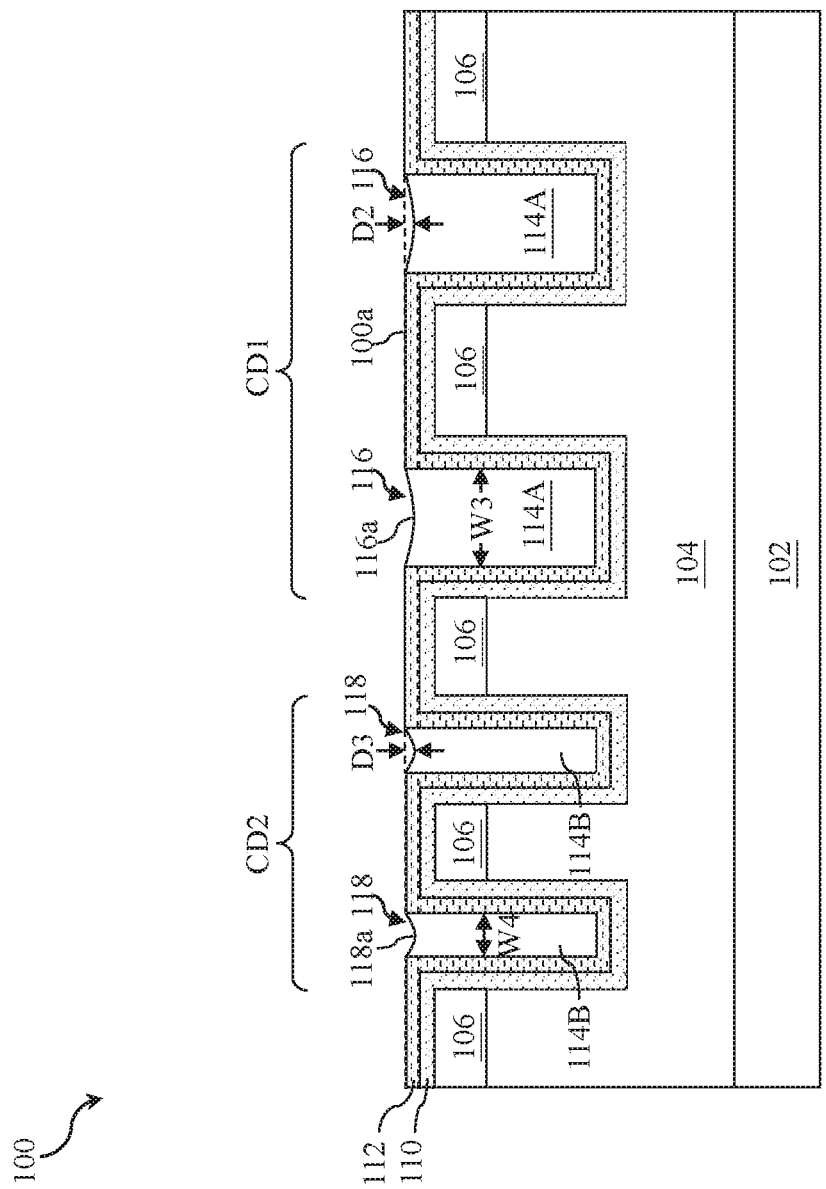

Referring now to FIGS. 1 and 5, the method 10 proceeds to block 22 where a partial CMP process is performed on the first metal feature 114. In some embodiments, the partial CMP may substantially remove the first metal feature 114, the first glue layer 112, and the first barrier layer 110 and stop on the first cap layer 106. In some embodiments, the first cap layer 106 may better resist removal via partial CMP than each overlying layer. In some other embodiments, the partial CMP may partially remove the first glue layer 112 and stop on the first glue layer 112 before reaching the first barrier layer 110 or the first cap layer 106. In some embodiments, the partial CMP may partially remove the first cap layer 106 and stop on the first cap layer 106. In some embodiments, the partial CMP may be performed using a turn table rotation rate of approximately 30-100 rpm, a top ring rotation rate of approximately 20-90 rpm, and a head down force of about 0.5-2.0 psi. In some embodiments, the partial CMP may employ end point detection by eddy current or optical methods. The partial CMP may use a first slurry having pH 6-8 and may include colloidal silica or fume silica, surfactant, and/or a metal corrosion inhibitor, such as benzotriazole. In some embodiments, the first slurry may be highly selective at removing the first metal feature 114 compared to the first glue layer 112.

Referring now to the first region CD1, in some embodiments, the partial CMP may cause dishing of the first metal feature 114A of about 0-50 Å creating a recess 116 having a recessed surface 116a. The recess 116 may have a width W3 of about 0.1-50 μm. The recess 116 may have a maximum depth D2 where a lowest portion of the recessed surface 116a is recessed by a distance D2 relative to a top surface 100a of the workpiece 100. In some embodiments, the maximum depth D2 may be about 0-50 Å. Referring now to the second region CD2, in some embodiments, the partial CMP may cause dishing of the second metal feature 114B of about 0-50 Å creating a recess 118 having a recessed surface 118a. The recess 118 may have a width W4 of about 0-100 nm. The recess 118 may have a maximum depth D3 where a lowest portion of the recessed surface 118a is recessed by a distance D3 relative to the top surface 100a of the workpiece 100. In some embodiments, the maximum depth D3 may be about 0-50 Å. In some embodiments, the maximum depth D3 may be less than the maximum depth D2 due to the recess 116 having greater width W3 compared to width W4 of recess 118. It will be appreciated that the dishing effect leading to formation of the recesses 116, 118 may be an unintentional byproduct of the partial CMP process. However, in some embodiments, formation of the recesses 116, 118 may be part of the design intent. It will be appreciated that features formed during semiconductor fabrication, in accordance with various embodiments, may be formed at different levels or heights within a same layer of the workpiece 100. In some instances, features being of larger critical dimension, such as the first metal feature 114A formed in the first region CD1 may undergo more dishing upon CMP compared to features being of relatively smaller critical dimension, such as the second metal feature 114B formed in the second region CD2. In other instances, trenches, plugs, metal lines, or other features overlaying earlier formed features having larger critical dimension may be formed at a lower height compared to trenches, plugs, metal lines, or other features in the same layer overlaying earlier formed features having relatively smaller critical dimension.

Figure 6:
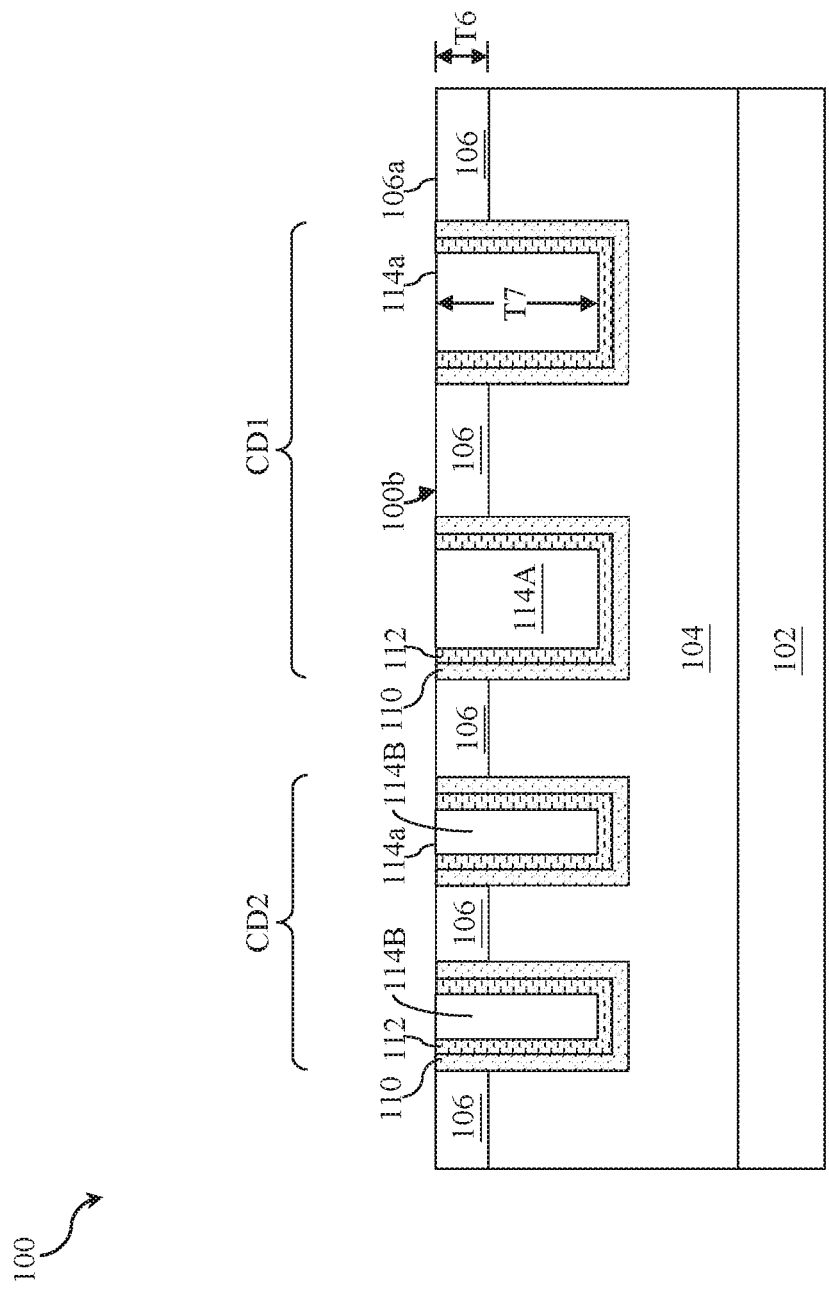

Referring now to FIGS. 1 and 6, the method 10 proceeds to block 24 where a CMP buffing process is performed on the workpiece 100. In some embodiments, the CMP buffing may substantially remove the first glue layer 112 and the first barrier layer 110 and stop on the first cap layer 106. In some embodiments, the first cap layer 106 may better resist removal via CMP buffing than each overlying layer. In some other embodiments, the first glue layer 112 and the first barrier layer 110 may already be removed during the partial CMP and the CMP buffing may partially remove the first cap layer 106 and stop on the first cap layer 106. In various embodiments, the CMP buffing may form a more even or flat top surface 100b on the workpiece 100 by partially removing the first cap layer 106. It will be appreciated that in the alternative, using a polish stop layer may form a more uneven top surface 100b. In some embodiments, the CMP buffing may be performed using a turn table rotation rate of approximately 60-90 rpm, a top ring rotation rate of approximately 57-85 rpm, and a head down force of about 0.5-2.0 psi. In some embodiments, the CMP buffing may use a lower rotation rate than the partial CMP. Using the lower rotation rate may improve control over the CMP buffing process based on time. In some embodiments, the CMP buffing may be a time-based process instead of using end point detection. A time span for CMP buffing may be about 5-90 s. In some other embodiments, end point detection may be employed. The CMP buffing uses a second slurry having pH 9-11 and may include colloidal silica or fume silica, surfactant, and/or a metal corrosion inhibitor, such as benzotriazole. In some embodiments, the second slurry may have a selectivity of about 1:5:1:1 (first metal feature 114: first glue layer 112: first barrier layer 110: first cap layer 106). In some embodiments as illustrated, the CMP buffing may remove the recesses 116, 118 formed by dishing of the first metal feature 114 during the partial CMP at block 22. In some embodiments, after CMP buffing, a top surface 100b of the workpiece 100 may be substantially flat. In some embodiments, after CMP buffing, a top surface 106a of the first cap layer 106 may be coplanar with a top surface 114a of the first metal feature 114. In some embodiments, the first cap layer 106 may be partially removed. After the CMP buffing, the first cap layer 106 may have a remaining thickness T6 of about 5-100 Å. The remaining thickness T6 may be less than the thickness T2 of the first cap layer 106 before the CMP buffing. In some embodiments, a minimum thickness T7 of the first metal feature 114 may be about 100-600 Å after the CMP buffing.

Figure 7:
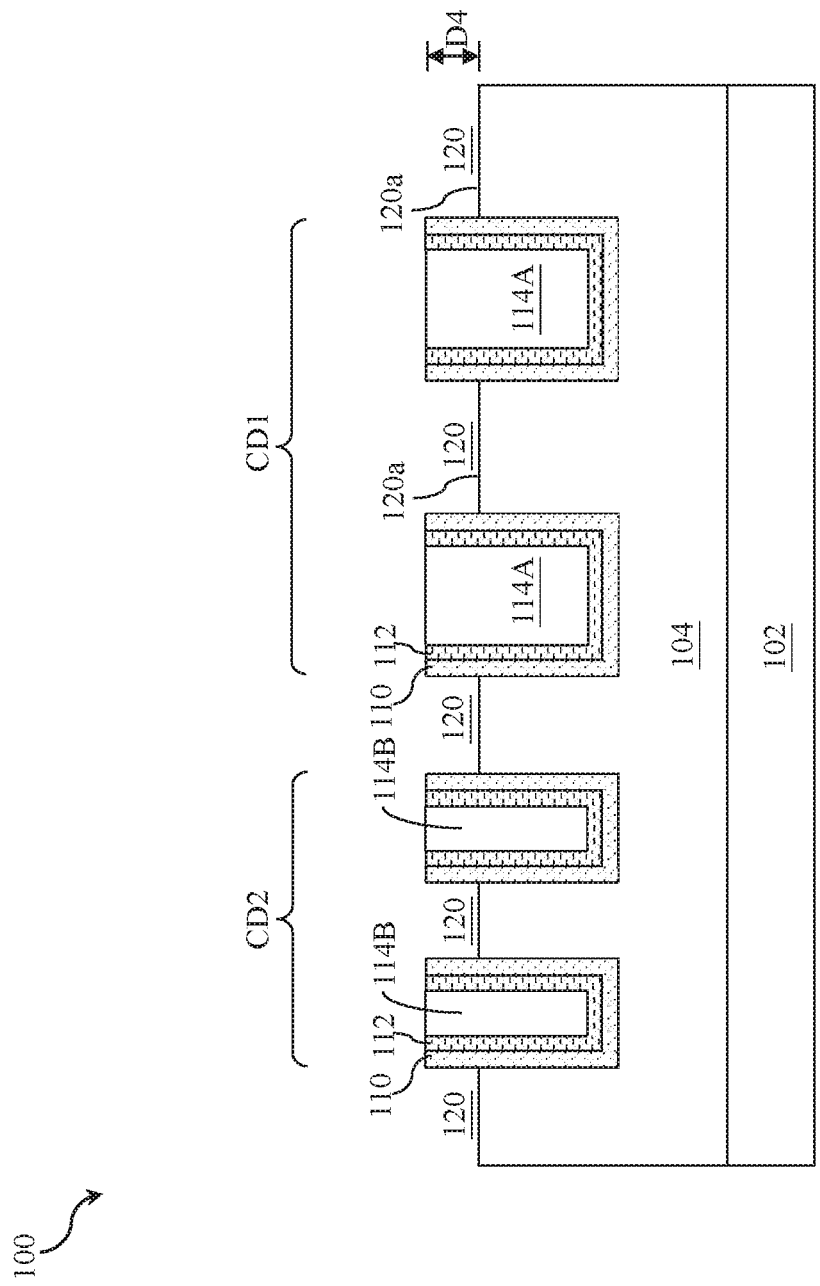

Referring now to FIGS. 1 and 7, the method 10 proceeds to block 26 where the first cap layer 106 is etched to form a second trench 120. The second trench 120 may have a flat lower surface 120a. In some embodiments, the first cap layer 106 may be etched using a wet chemical etching process. In some embodiments, the wet etching may selectively remove the first cap layer 106 relative to the first dielectric layer 104. In some embodiments, the wet etching process may use a solution including about 0.1-10% $H_2O_2$, a TiN, MnN, CoN, WN, or MoN chelating agent, and/or a metal corrosion inhibitor. In some embodiments, the solution may have pH 6-1. In some embodiments, the wet etching process may be performed at a temperature of about 25-60° C. In some embodiments, a depth D4 of the second trench 120 may be about 5-100 Å. In some embodiments, the depth D4 may equal the remaining thickness T6 of the first cap layer 106 after the CMP buffing.

Figure 8:
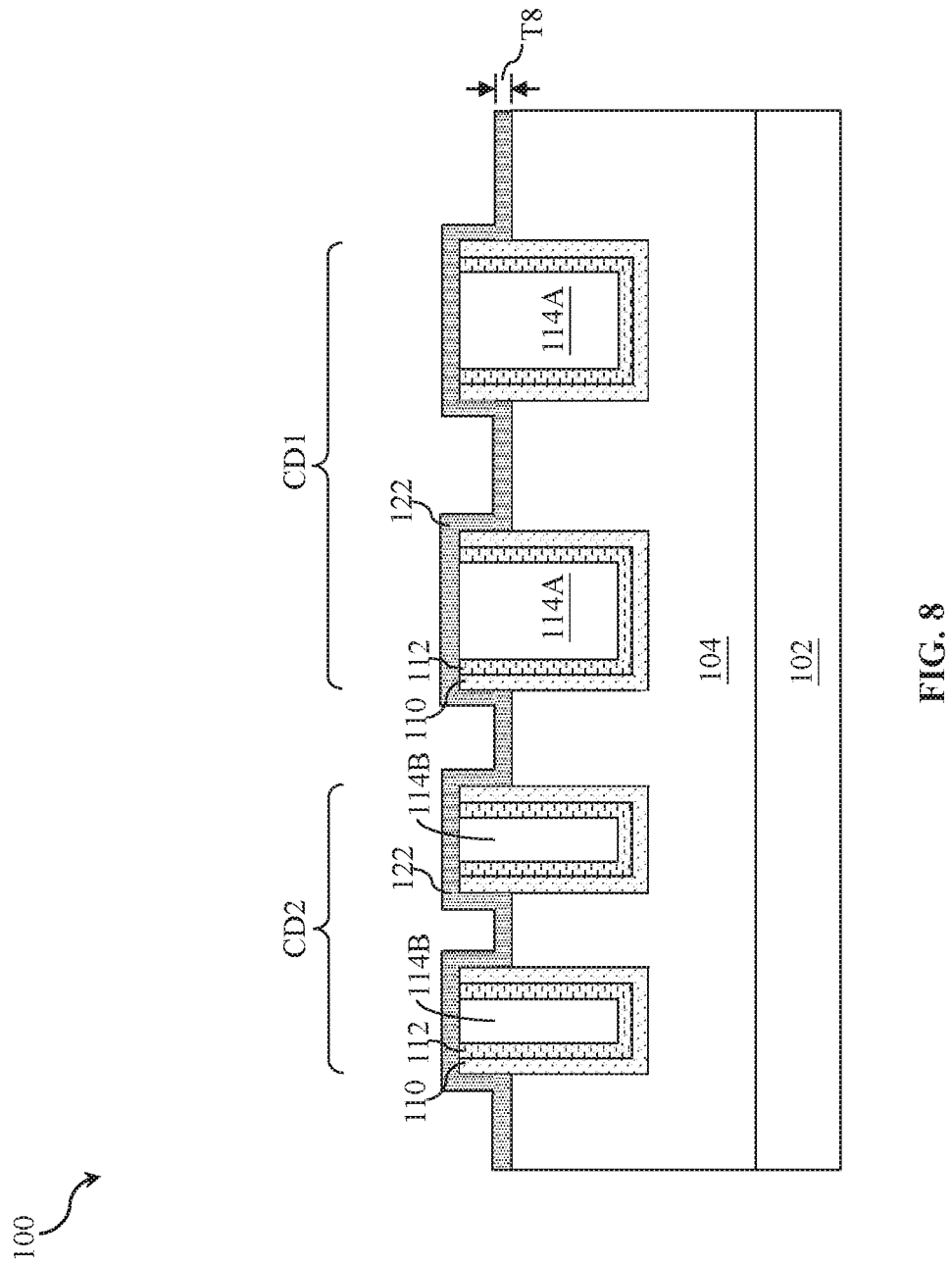

Referring now to FIGS. 1 and 8, the method 10 proceeds to block 28 where an etch stop layer (ESL) 122 is deposited over the workpiece 100. The ESL 122 may include a silicon or aluminum-based material, such as SiN, SiCO, SiCN, SiCON, AlOx, AlON, AlNx, or combinations thereof. In some embodiments, the ESL 122 may be deposited over the workpiece 100 using processes that involve use of precursors of the ESL 122, such as PVD, CVD, or ALD. In some embodiments, the ESL 122 may have a thickness T8 of about 20-50 Å.

Figure 9:
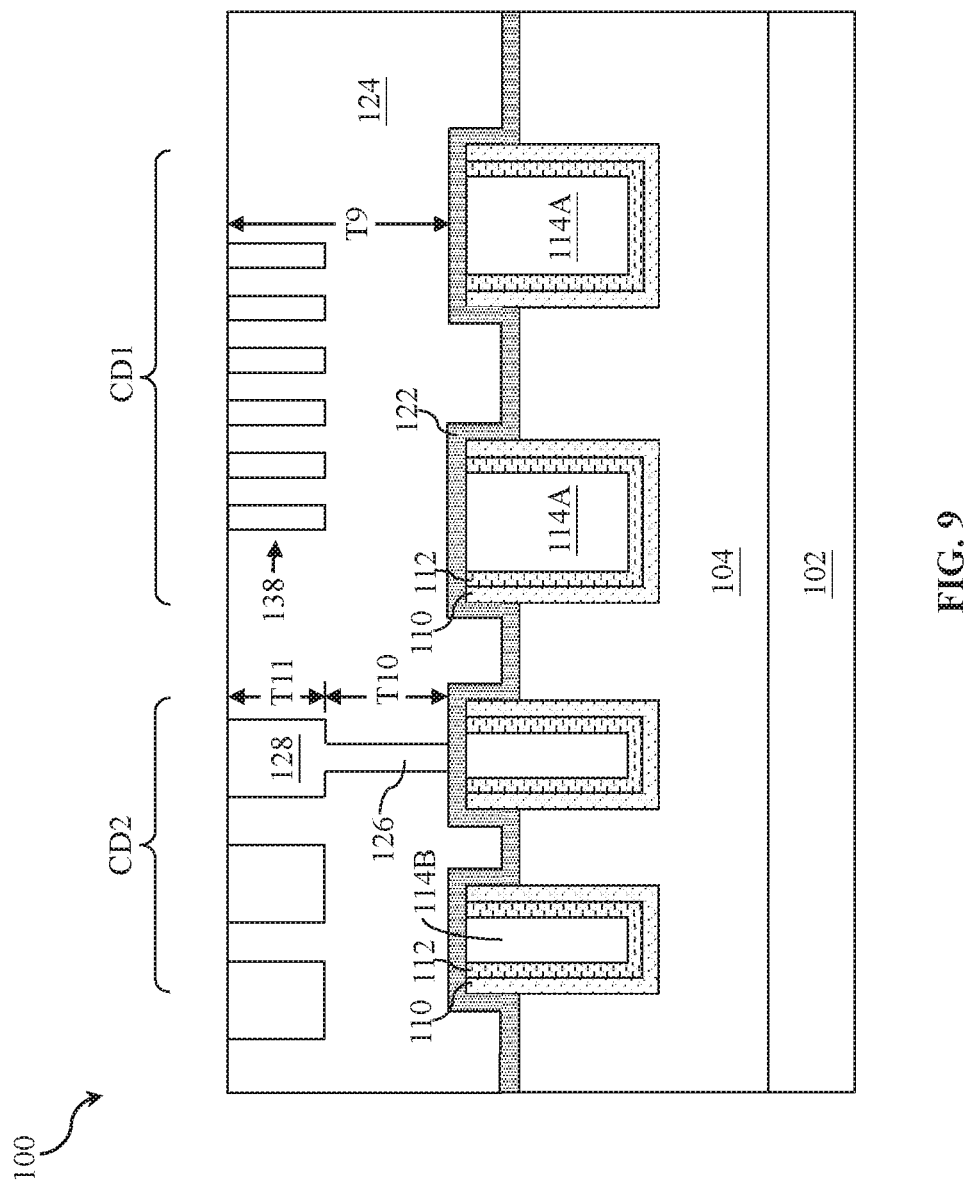

Referring now to FIGS. 1 and 9, the method 10 proceeds to block 30 where a second dielectric layer 124 is deposited over the ESL 122. The second dielectric layer 124 may include a dielectric material, such as silicon oxide, high-k dielectric material, other suitable dielectric material, or combinations thereof. High-k dielectric material generally refers to dielectric materials having a high dielectric constant, for example, greater than a dielectric constant of silicon oxide (k≈3.9). Exemplary high-k dielectric materials include hafnium, aluminum, zirconium, lanthanum, tantalum, titanium, yttrium, oxygen, nitrogen, other suitable constituent, or combinations thereof. In some embodiments, the second dielectric layer 124 may have a thickness T9 of about 300-1500 Å.

Referring still to FIGS. 1 and 9, the method 10 proceeds to block 32 where further processes are performed. For example, additional metal features may be formed in the second dielectric layer 124 to form additional conductive layers of a multilayer interconnect (MLI). An MLI structure may include a plurality of conductive layers. In some embodiments, a via 126 is formed in the second dielectric layer 124. The via 126 may be formed using an etching process. In some embodiments the via 126 may have a height of about 100-600 Å. In some embodiments, the via 126 may be filled with a conductive metal plug having a thickness T10 of about 100-600 Å. In some embodiments, a first conductive feature 128 and a second conductive feature 138 are formed in the second dielectric layer 124. In some embodiments, the conductive features 128, 138 include copper, cobalt, ruthenium, molybdenum, chromium, tungsten, manganese, rhodium, iridium, nickel, palladium, platinum, silver, gold, aluminum, or combinations thereof. In some embodiments, a composition of the conductive features 128, 138 may be different than a composition of the first metal feature 114. In some embodiments, the conductive feature 128, 138 may be deposited using PVD, CVD, or ALD. In some other embodiments, the conductive features 128, 138 may be formed using any of the materials and processes described with reference to the first metal feature 114, and in some examples, the first metal feature 114 and the conductive features 128, 138 may be identical. In some embodiments, the conductive features 128, 138 may have a thickness T11 of about 100-600 Å.

Figure 10A:
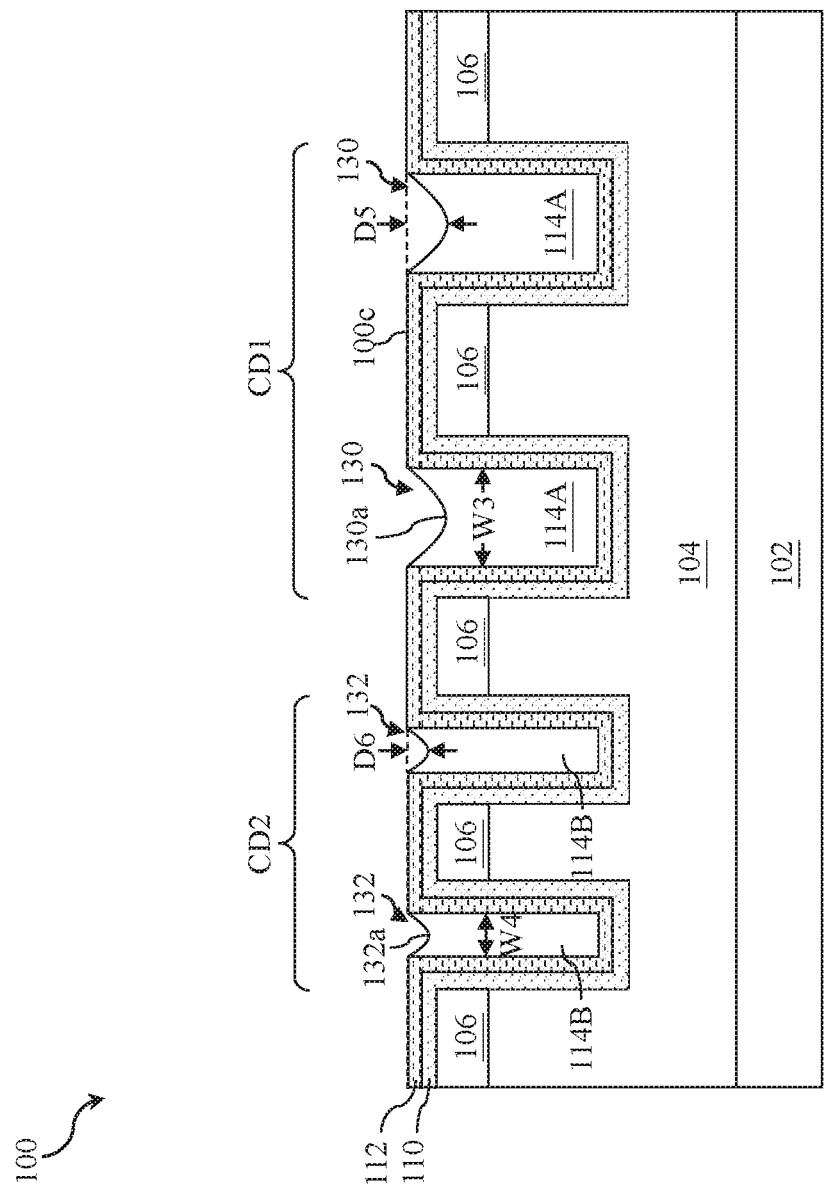

Referring now to FIG. 10A, another embodiment of the workpiece 100 is illustrated, where a CMP over-polish is performed at block 22. Relative to the partial CMP of FIG. 5, the over-polish process may involve performing CMP for a longer duration. More particularly, the CMP over-polish may continue for a longer period of time after reaching the first cap layer 106. Referring now to the first region CD1, in such embodiments, the partial CMP over-polish may cause dishing of the first metal feature 114A of about 50-150 Å creating a recess 130 having a recessed surface 130a. The recess 130 may have a width W3 of about 0.1-50 µm. The recess 130 may have a maximum depth D5 where a lowest portion of the recessed surface 130a is recessed by a distance D5 relative to a top surface 100c of the workpiece 100. In some embodiments, the maximum depth D5 may be about 50-150 Å. Referring now to the second region CD2, in such embodiments, the partial CMP over-polish may cause dishing of the second metal feature 114B of about 50-150 Å creating a recess 132 having a recessed surface 132a. The recess 132 may have a width W4 of about 0-100 nm. The recess 132 may have a maximum depth D6 where a lowest portion of the recessed surface 132a is recessed by a distance D6 relative to the top surface 100c of the workpiece 100. In some embodiments, the maximum depth D6 may be about 50-150 Å. In one or more embodiments, the over-polish may be performed so that the maximum depth D5 in the first region CD1 is greater than the maximum depth D6 in the second region CD2. The method may incorporate detailed description of like structures from FIG. 5 without limitation.

Figure 10B:
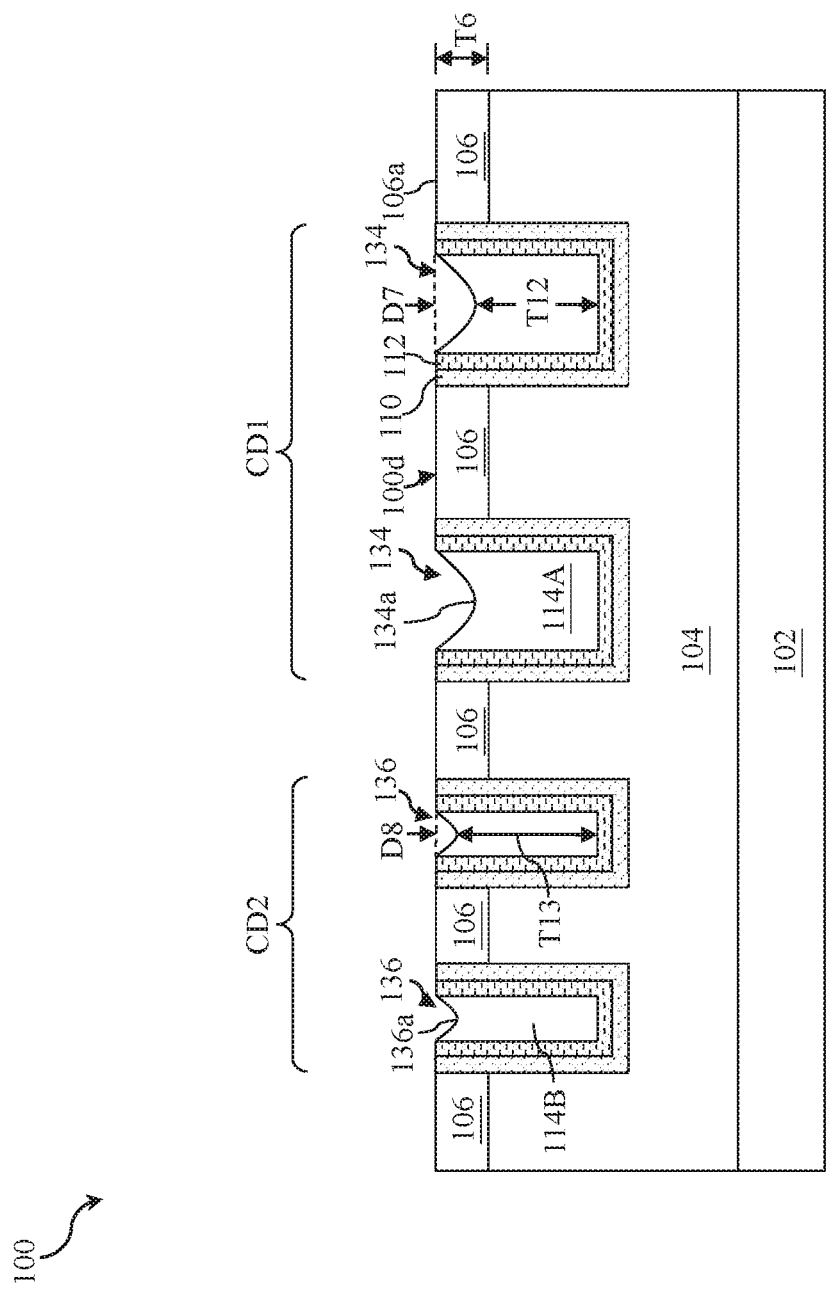

Referring now to FIG. 10B, the workpiece 100 illustrated in FIG. 10A proceeds to block 24 where a CMP buffing process is performed. The CMP buffing employs a third slurry having a selectivity of about 2:5:1:1 (first metal feature 114: first glue layer 112: first barrier layer 110: first cap layer 106). Referring now to the first region CD1, in some embodiments, the CMP buffing may result in dishing of the first metal feature 114A of about 50-150 Å creating a recess 134 having a recessed surface 134a. The recess 134 may have a maximum depth D7 where a lowest portion of the recessed surface 134a is recessed by a distance D7 relative to a top surface 100d of the workpiece 100. In some embodiments, the maximum depth D7 may be about 50-150 Å. In some other embodiments, the maximum depth D7 may be about 5-100 Å. In some embodiments, a minimum thickness T12 of the first metal feature 114A may be about 95-500 Å. The CMP buffing may affect the recess 130 in various ways to create the recess 134, including one of increasing, decreasing, and maintaining the recess 130. In some embodiments, the maximum depth D7 may be equal to the maximum depth D5.

Referring now to the second region CD2, in some embodiments, the CMP buffing may result in dishing of the second metal feature 114B of about 50-150 Å creating a recess 136 having a recessed surface 136a. In some embodiments, a bottom of recess 136 may be higher than a bottom of recess 134. The recess 136 may have a maximum depth D8 where a lowest portion of the recessed surface 136a is recessed by a distance D8 relative to a top surface 100d of the workpiece 100. In some embodiments, the maximum depth D8 may be about 50-150 Å. In some other embodiments, the maximum depth D8 may be about 5-100 Å. In some embodiments, a minimum thickness T13 of the second metal feature 114B may be about 95-500 Å. The CMP buffing may affect the recess 132 in various ways to create the recess 136, including one of increasing, decreasing, and maintaining the recess 132. In some embodiments, the maximum depth D8 may be equal to the maximum depth D6. In one or more embodiments, the effect of having maximum depth D5 in the first region CD1 being greater than the maximum depth D6 in the second region CD2 may not be affected by the CMP buffing where the maximum depth D7 may be greater than the maximum depth D8. The method may incorporate detailed description of like structures from FIG. 6 without limitation.

Figure 10C:
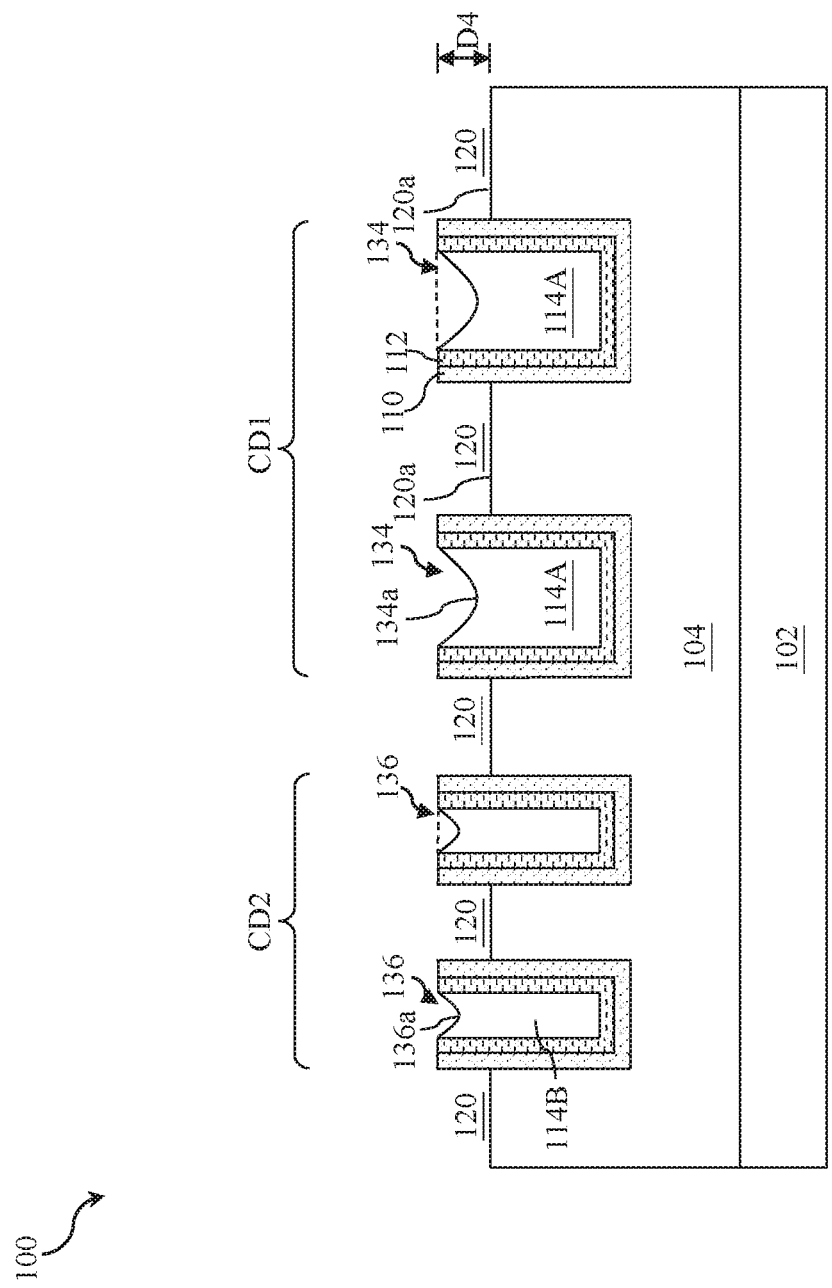

Referring now to FIG. 10C, the workpiece 100 illustrated in FIG. 10B proceeds to block 26 where the first cap layer 106 is etched to form a second trench 120. At this stage in a fabrication, layers may have heights relative to each other as follows. In some embodiments, a top surface of the first barrier layer 110 and a top surface of the first glue layer 112 may be higher than the bottom of recess 136. In some embodiments, the bottom of recess 136 may be higher than a top surface of the first dielectric layer 104. In some embodiments, the top surface of the first dielectric layer 104 may be higher than the bottom of recess 134. The method may incorporate detailed description of like structures from FIG. 7 without limitation.

Referring now to FIG. 10D, the workpiece 100 illustrated in FIG. 10C proceeds to block 28 where the ESL 122 is deposited over the workpiece 100. The method may incorporate detailed description of like structures from FIG. 8 without limitation.

Figure 10E:
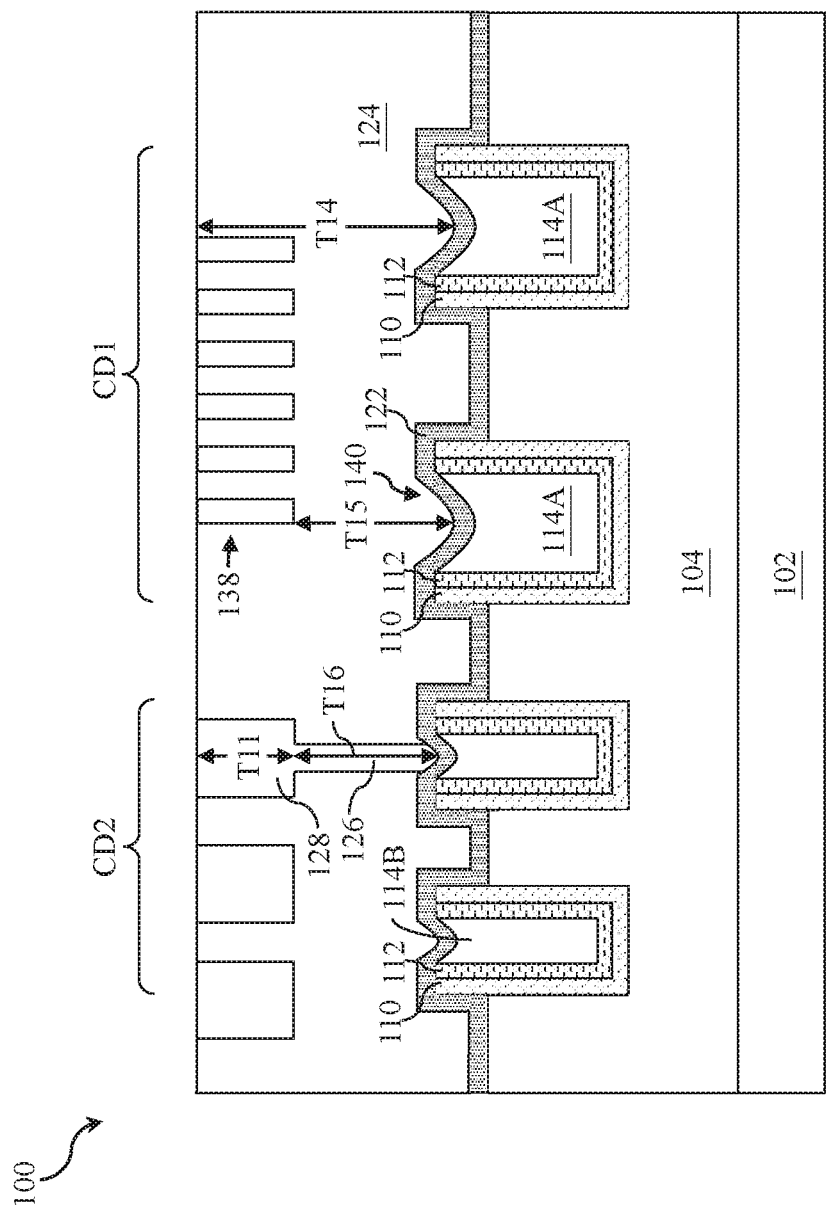

Referring now to FIG. 10E, the workpiece 100 illustrated in FIG. 10D proceeds to block 30 where the second dielectric layer 124 is deposited over the ESL 122. In some embodiments, the second dielectric layer 124 may have a thickness T14 of about 305-1600 Å. Referring still to FIG. 10E, the workpiece 100 proceeds to block 32 where further processes are performed. In some embodiments, conformal deposition of the ESL 122 at block 28 may form a recess 140 in the first region CD1. In some embodiments, due to larger dishing effect on the first metal feature 114A compared to the second metal feature 114B, an average height of top surfaces in the first region CD1 may be lower than an average height of top surfaces in the second region CD2 after the etching of the first cap layer 106 and/or after the deposition of the ESL 122. At block 30, the recess 140 may be filled by the second dielectric layer 124. In some embodiments, deposition of the second dielectric layer 124 may be conformal on the first dielectric layer 104 and/or the ESL 122. Thus, after conformal deposition, a top surface of the second dielectric layer 124 in the first region CD1 may be lower than a top surface of the second dielectric layer 124 in the second region CD2. At block 32, first and second conductive features 128, 138 may be formed in the second dielectric layer 124. In some embodiments, the second conductive feature 138 in the first region CD1 may be formed slightly lower than the first conductive feature 128 in the second region CD2 due to the second dielectric layer 124 being formed lower in the first region CD1. In some embodiments, a bottom surface of the second conductive feature 138 may be at a lower height compared to a bottom surface of the first conductive feature 128. Likewise, a difference in height of the second dielectric layer 124 between the first and second regions CD1, CD2 may be approximately the same as the difference between the depth D7 and the depth D8, as described with reference to FIG. 10B. In some embodiments, a thickness T15 between bottom surface of recess 140 and bottom of the second conductive feature 138 may be about 105-700 Å. In some embodiments, the via 126 may be filled with a conductive metal plug having a thickness T16 of about 105-700 Å. As illustrated in FIG. 10E, the second conductive feature 138 may be of smaller critical dimension than the first conductive feature 128. As mentioned earlier, it will be appreciated that since the second conductive feature 138 is disposed above the first metal feature 114A having larger critical dimension, and the first conductive feature 128 is disposed above the second metal feature 114B having smaller critical dimension, then the second conductive feature 138 may be formed at a slightly lower level or height than the first conductive feature 128 within the same layer of the workpiece 100. Therefore, a top surface of the second conductive feature 138 may be slightly lower than a top surface of the first conductive feature 128. Thereafter, a CMP process may be performed on the top surfaces of the first and second conductive features 128, 138. Due to the first conductive feature 128 having larger critical dimension than the second conductive feature 138, the first conductive feature 128 may undergo a larger dishing effect, similar to the effect described with reference to FIGS. 10A-10B for first and second metal features 114A, 114B. Therefore, even though the top surface of the second conductive feature 138 may have been slightly lower than the top surface of the first conductive feature 128 before CMP, the top surfaces of the first and second conductive features 128, 138 may be at the same height (aligned) after CMP. The foregoing method may incorporate detailed description of like structures from FIG. 9 without limitation.

FIGS. 11A-11D are cross-sectional views illustrating additional embodiments of a semiconductor device after completion of block 26 of the method 10 illustrated in FIG. 1 according to one or more aspects of the present disclosure. In particular, FIGS. 11A-11D illustrate variations in structure of the first dielectric layer 104, the first metal feature 114, and the first glue layer 112.

Figure 11A:
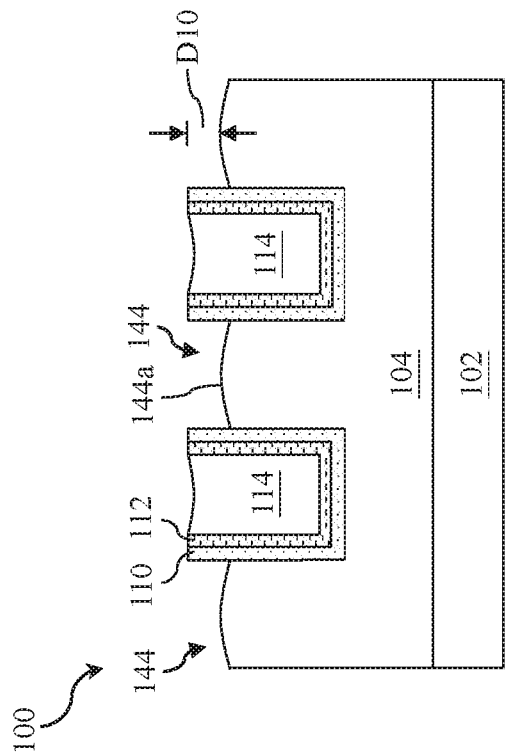
FIGS. 11A-11D are cross-sectional views illustrating additional embodiments of a semiconductor device at various stages of the method depicted in FIG. 1 according to one or more aspects of the present disclosure.

Referring now to FIG. 11A, another embodiment of the workpiece 100 is illustrated, where at block 26 the first cap layer 106 is etched to expose a trench 142. In some embodiments, etching at block 26 may remove a portion of the first dielectric layer 104 forming the trench 142. In some embodiments, a CMP process may form the trench 142. In the embodiment illustrated in FIG. 11A, the CMP process may have a relatively high polish rate on the first dielectric layer 104. In some embodiments, a CMP slurry may selectively remove the first dielectric layer 104 forming the trench 142. The trench 142 may have a concave lower surface or recess 142a. The trench 142 may have a maximum depth D9. In some embodiments, the maximum depth D9 may be about 55-200 Å. In some embodiments, the maximum depth D9 may be greater than the depth D4 of the trench 120 having the flat lower surface 120a. The method may incorporate detailed description of like structures from FIGS. 5-7 without limitation.

Figure 11B:
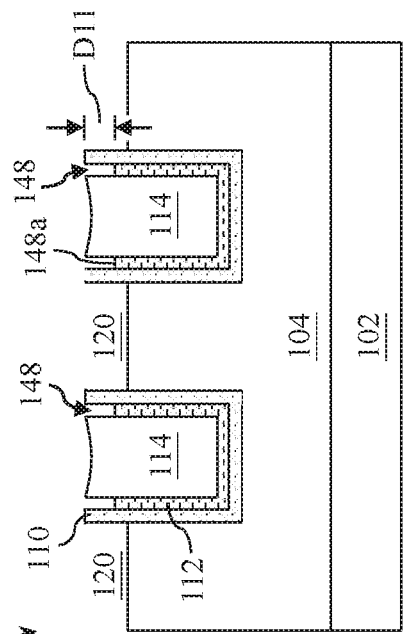

Referring now to FIG. 11B, another embodiment of the workpiece 100 is illustrated, where at block 26 the first cap layer 106 is etched to expose a trench 144. In some embodiments, etching at block 26 may remove a portion of the first dielectric layer 104 forming the trench 144. In some embodiments, a CMP process may form the trench 144. In the embodiment illustrated in FIG. 11B, the CMP process may have a relatively low polish rate on the first dielectric layer 104. In some embodiments, a CMP slurry may selectively retain the first dielectric layer 104 forming the trench 144. The trench 144 may have a convex lower surface or hump 144a. The trench 144 may have a minimum depth D10. In some embodiments, the minimum depth D10 may be about 45-145 Å. In some embodiments, the minimum depth D10 may be less than the depth D4 of the trench 120 having the flat lower surface 120a. The method may incorporate detailed description of like structures from FIGS. 5-7 without limitation.

Figure 11C:
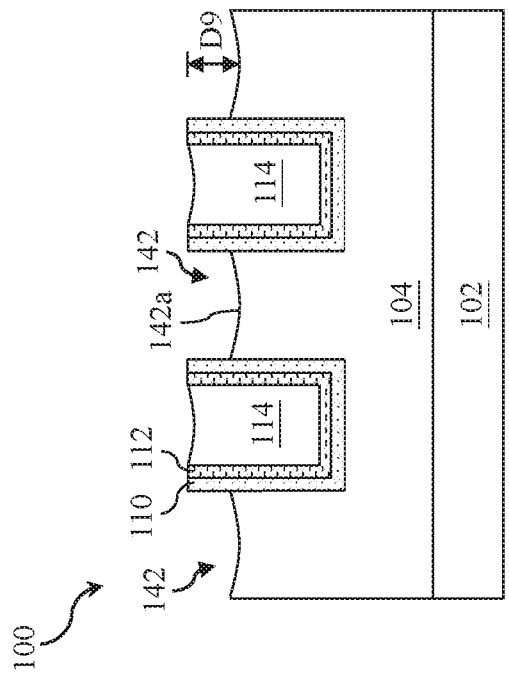

Referring now to FIG. 11C, another embodiment of the workpiece 100 is illustrated, where at block(s) 22 and/or 24 the partial CMP and/or CMP buffing create a hump 146 on the first metal feature 114. The hump 146 may include a convex upper surface 146a. In some embodiments, the partial CMP and/or CMP buffing may have a relatively low polish rate on the first metal feature 114. In some embodiments, a CMP process may have a polish rate on the first metal feature 114 lower than a polish rate on the first cap layer 106 creating an erosion effect forming the hump 146. In some embodiments, a CMP slurry may selectively retain the first metal feature 114 forming the hump 146. In some embodiments, the first metal feature 114 may have a maximum thickness T17 of about 100-600 Å. The method may incorporate detailed description of like structures from FIGS. 5-6 without limitation.

Figure 11D:
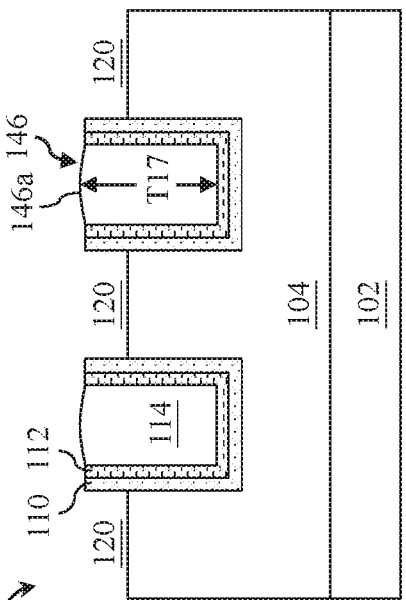

Referring now to FIG. 11D, another embodiment of the workpiece 100 is illustrated, where at block 26 the first glue layer 112 is etched to create a sidewall recess 148 having a lower surface 148a. The sidewall recess 148 may be formed by etching the first glue layer 112 relative to the first metal feature 114 and the first barrier layer 110. In some embodiments, the sidewall recess 148 may be formed by etching during the etching of the first cap layer 106. In some embodiments, the sidewall recess 148 may be formed by etching using the same process and etching solution as the first cap layer 106, and the method may incorporate detailed description of like structures from FIG. 7 without limitation. In some embodiments, the first glue layer 112 is partially removed by a wet etching process. In some embodiments, the wet etching process may be helped by a galvanic potential difference between the first glue layer 112 and each of the first metal feature 114 and the first barrier layer 110 thereby forming the sidewall recess 148, at least in part, through a corrosion process. The sidewall recess 148 may have a depth D11 of about 0-100 Å. The method may incorporate detailed description of like structures from FIG. 7 without limitation.

According to one or more aspects of the present disclosure, any of the structures illustrated in FIGS. 2-9, 10A-10E, and 11A-11D may be combined to create a semiconductor device contact structure. In some embodiments, different structural features and variations may be shown in isolation for the sake of clarity and are not intended to be limiting beyond what is specifically recited in the claims that follow. It will be appreciated that the various embodiments may be modified with aspects of other embodiments without limitation.

While a few advantages of certain embodiments described herein have been described, other advantages of using one or more of the present embodiments may be present and no particular advantage is required for the embodiments described in the present disclosure. In one example, the methods provided herein allow fabrication and planarization of conductive features of different sizes and packing densities to be performed at the same time, thereby reducing the cost and complexity associated with device production. In another example, methods provided herein are configured to prevent penetration of metal oxide or metal ion contaminants into low-K material, lowering the occurrence of potential reliability issues such as TDDB.

The present disclosure provides for many different embodiments. In one embodiment, a method is provided. The method includes providing a workpiece including a semiconductor substrate, a first dielectric layer over the semiconductor substrate, and a first cap layer over the first dielectric layer; forming a first metal feature in the first dielectric layer; performing a first chemical mechanical polishing/planarization (CMP) process on the first metal feature using a first rotation rate; performing a second CMP process on the first metal feature using a second rotation rate slower than the first rotation rate, wherein the second CMP process is time-based, and wherein the second CMP process stops on the first cap layer; and after the performing of the second CMP process, removing the first cap layer. In some embodiments, the first cap layer includes TiN, MnN, CoN, WN, or MoN, wherein the first cap layer is removed by wet etching. In some embodiments, a solution used in the wet etching of the cap layer includes a TiN, MnN, CoN, WN, or MoN chelating agent. In some embodiments, a solution used in the wet etching of the cap layer includes 0.1-10% H2O2. In some embodiments, the method includes forming a trench in the first cap layer and the first dielectric layer; and depositing a first barrier layer over the first cap layer and the first dielectric layer before the forming of the first metal feature. In some embodiments, the method includes depositing a first glue layer over the first barrier layer before the forming of the first metal feature.

In some embodiments, the method includes providing a workpiece including a semiconductor substrate, a first dielectric layer over the semiconductor substrate, and a first cap layer over the first dielectric layer; forming a first metal layer over the first dielectric layer including a first metal feature in a first region having a first critical dimension (CD) and a second metal feature in a second region having a second CD less than the first CD; performing a first CMP process on the first metal layer forming a first recess in the first metal feature having a first maximum depth and a second recess in the second metal feature having a second maximum depth less than the first maximum depth; depositing a second dielectric layer over the first and second metal features; and forming a second metal layer over the second dielectric layer including a third metal feature in the first region having a third CD and a fourth metal feature in the second region having a fourth CD greater than the third CD.

In another embodiment, a semiconductor structure is provided. The semiconductor structure includes a semiconductor substrate; a first dielectric layer disposed over the semiconductor substrate, the first dielectric layer having a trench; a first barrier layer disposed conformally in the trench; a first glue layer disposed conformally over the first barrier layer; and a first metal feature disposed in the trench over the first glue layer, wherein a top surface of the first dielectric layer is below top surfaces of the first barrier layer, the first glue layer, and the first metal feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a workpiece including a semiconductor substrate, a first dielectric layer over the semiconductor substrate, and a first cap layer over the first dielectric layer;

forming a first metal layer in the first dielectric layer including a first metal feature in a first region having a first critical dimension (CD) and a second metal feature in a second region having a second CD less than the first CD;
performing a first chemical mechanical polishing/planarization (CMP) process on the first metal layer using a first rotation rate;
performing a second CMP process on the first metal layer using a second rotation rate slower than the first rotation rate, resulting in a first recess in the first metal feature having a first maximum depth and a second recess in the second metal feature having a second maximum depth less than the first maximum depth, wherein the second CMP process is time-based, and wherein the second CMP process stops on the first cap layer;
after the performing of the second CMP process, removing the first cap layer;
depositing a second dielectric layer over the first and second metal features; and
forming a second metal layer over the second dielectric layer including a third metal feature in the first region having a third CD and a fourth metal feature in the second region having a fourth CD greater than the third CD.

2. The method of claim 1, wherein the first CMP process has a first polishing rate to the first metal layer, wherein the second CMP process has a second polishing rate to the first metal feature lower than the first polishing rate.

3. The method of claim 1, wherein the first CMP process uses a first slurry having pH 6-8 and including a colloidal or fume silica, a surfactant, and a metal corrosion inhibitor, wherein the first slurry selectively removes the first metal layer.

4. The method of claim 1, wherein the first metal layer is formed over a first glue layer, wherein the second CMP process uses a second slurry having pH 9-11 and including a colloidal or fume silica, a surfactant, and a metal corrosion inhibitor, wherein the second slurry selectively removes the first glue layer.

5. The method of claim 4, wherein the first CMP process has a third polishing rate to the first glue layer, wherein the second CMP process has a fourth polishing rate to the first glue layer higher than the third polishing rate.

6. The method of claim 1, wherein the first rotation rate has a first component of about 30-100 rpm and a second component of about 20-90 rpm.

7. The method of claim 1, wherein the first cap layer includes a metal nitride.

8. The method of claim 1, wherein the first cap layer has a first dielectric constant greater than a second dielectric constant of the first dielectric layer.

9. The method of claim 1, wherein the first cap layer is removed by wet etching using a solution including about 0.1-10% $H_2O_2$, a metal nitride chelating agent, and a metal corrosion inhibitor.

10. A method, comprising:
providing a workpiece including a semiconductor substrate, a first dielectric layer over the semiconductor substrate, and a first cap layer over the first dielectric layer;
forming a first metal layer over the first dielectric layer including a first metal feature in a first region having a first critical dimension (CD) and a second metal feature in a second region having a second CD less than the first CD;
performing a first CMP process on the first metal layer forming a first recess in the first metal feature having a first maximum depth and a second recess in the second metal feature having a second maximum depth less than the first maximum depth;
depositing a second dielectric layer over the first and second metal features; and
forming a second metal layer over the second dielectric layer including a third metal feature in the first region having a third CD and a fourth metal feature in the second region having a fourth CD greater than the third CD.

11. The method of claim 10, further comprising performing a second CMP process, wherein the second CMP process is time-based, and wherein the second CMP process stops on the first cap layer.

12. The method of claim 10, further comprising removing the first cap layer before depositing the second dielectric layer.

13. The method of claim 10, wherein the first recess has a first bottom surface, and wherein the second recess has a second bottom surface higher than the first bottom surface.

14. The method of claim 13, wherein the third metal feature is formed at a first distance from the first bottom surface, wherein the fourth metal feature is formed at a second distance from the second bottom surface, the first distance and the second distance being substantially the same.

15. The method of claim 14, wherein top surfaces of the third and fourth metal features are aligned with each other, and wherein a bottom surface of the third metal feature is lower than a bottom surface of the fourth metal feature.

16. A method, comprising:
providing a workpiece including a semiconductor substrate, a first dielectric layer over the semiconductor substrate, and a first cap layer over the first dielectric layer;
forming a first metal layer in the first dielectric layer including a first metal feature in a first region having a first critical dimension (CD) and a second metal feature in a second region having a second CD less than the first CD;
performing a first chemical mechanical polishing/planarization (CMP) process on the first metal layer using a first rotation rate and a first slurry having a first pH value;
performing a second CMP process on the first metal layer using a second rotation rate slower than the first rotation rate and a second slurry having a second pH value being greater than the first pH value, wherein the second CMP process stops on the first cap layer;
after the performing of the second CMP process, removing the first cap layer by wet etching;
depositing a second dielectric layer over the first and second metal features; and
forming a second metal layer over the second dielectric layer including a third metal feature in the first region having a third CD and a fourth metal feature in the second region having a fourth CD greater than the third CD.

17. The method of claim 16, wherein the first CMP process has a first polishing rate to the first metal layer, wherein the second CMP process has a second polishing rate to the first metal layer lower than the first polishing rate.

18. The method of claim 16, wherein
the first metal layer is formed over a first glue layer;

the first pH value of the first slurry ranges between 6 and 8, and the first slurry selectively removes the first metal layer; and the second pH value of the second slurry ranges between 9 and 11, and the second slurry selectively removes the first glue layer.

19. The method of claim 18, wherein the first CMP process has a third polishing rate to the first glue layer, wherein the second CMP process has a fourth polishing rate to the first glue layer higher than the third polishing rate.

20. The method of claim 16, wherein the first cap layer includes a metal nitride; and the first cap layer is removed using a solution including about 0.1-10% $H_2O_2$, a metal nitride chelating agent, and a metal corrosion inhibitor.

* * * * *